US006445253B1

(12) United States Patent
Talbot

(10) Patent No.: US 6,445,253 B1
(45) Date of Patent: Sep. 3, 2002

(54) VOLTAGE-CONTROLLED OSCILLATOR WITH AC COUPLING TO PRODUCE HIGHLY ACCURATE DUTY CYCLE SQUARE WAVE OUTPUT

(75) Inventor: Gerald Talbot, Concord, MA (US)

(73) Assignee: API Networks, Inc., Concord, MA (US)

( * ) Notice: Subject to any disclaimer, the term of this patent is extended or adjusted under 35 U.S.C. 154(b) by 0 days.

(21) Appl. No.: 09/740,143

(22) Filed: Dec. 18, 2000

(51) Int. Cl.[7] ................................................ H03B 5/00
(52) U.S. Cl. ........................ 331/57; 331/74; 327/165; 327/172
(58) Field of Search ............................. 331/57, 74, 77; 327/165, 167, 172, 175, 180

(56) References Cited

U.S. PATENT DOCUMENTS

| 4,689,581 A | 8/1987 | Talbot ............................ 331/1 |
| 5,070,254 A | * 12/1991 | Summers ...................... 327/175 |
| 5,912,574 A | 6/1999 | Bhagwan ..................... 327/157 |
| 5,939,950 A | 8/1999 | Kamei .......................... 331/57 |
| 5,963,102 A | 10/1999 | Pang ............................ 331/57 |
| 6,005,445 A | 12/1999 | Katakura ..................... 331/34 |
| 6,008,700 A | 12/1999 | Pietrzyk ...................... 331/45 |
| 6,011,444 A | 1/2000 | Takada et al. ................ 331/57 |

* cited by examiner

Primary Examiner—Arnold Kinkead
(74) Attorney, Agent, or Firm—Mills & Onello LLP

(57) ABSTRACT

A voltage-controlled oscillator circuit includes a ring oscillator circuit for generating a signal having a series of pulses. The signal with the series of pulses is ac coupled to a filter circuit which converts the series of pulses into a substantially sinusoidal signal which is substantially symmetrical about the reference potential of the system. The sinusoidal signal is applied to an amplifier which converts the sinusoidal signal into a square wave. Because the square wave is generated as an amplified sine wave, it exhibits a high degree of symmetry, i.e., it has a highly accurate 50-50 duty cycle, which makes it applicable in demanding settings such as serving as a clock signal in a high-speed microprocessor system in which both rising and falling edges of the clock signal are used to synchronize events.

14 Claims, 2 Drawing Sheets

US 6,445,253 B1

VOLTAGE-CONTROLLED OSCILLATOR WITH AC COUPLING TO PRODUCE HIGHLY ACCURATE DUTY CYCLE SQUARE WAVE OUTPUT

BACKGROUND OF THE INVENTION

A voltage-controlled oscillator (VCO) produces a periodic time-varying output signal the frequency of which is controlled by the voltage level of an input signal. VCOs are widely used in circuits such as phase-locked loops to provide controllable periodic signals, and they are also commonly used to generate clock signals for microprocessor systems.

Recent improvements in the speed of microprocessor systems have caused an increased demand for faster clock signals with highly controllable and accurate signal attributes, such as duty cycle, mark space ratio, rise and fall times, etc. In fact, in many systems, to improve system processing speed, both the rising and falling edges of clock signals are being used to trigger events. In such systems, it is very important that the clock signals be symmetrical, i.e., that they have very precise 50-50 duty cycles. In conventional VCOs, this is very difficult to achieve because the signals are typically generated in purely digital form by digital circuitry such as inverters in ring oscillator circuits. Ring oscillator frequency is typically controlled by varying $V_{DD}$. This shifts the peak-to-peak amplitude of the output of the ring oscillator such that when it is amplified to the logic swing voltage of the chip, further asymmetry in the output waveform is introduced. Because of many factors such as varying tplh and tphl ratios of the inverters, rising and falling edges of square pulses are different. The resulting square waves are typically not symmetrical and therefore cannot readily be used to control timing in these new high-speed systems.

SUMMARY OF THE INVENTION

The present invention is directed to a voltage-controlled oscillator circuit and a method of generating a square wave signal which overcome these drawbacks of the prior art. The VCO of the invention includes a ring oscillator circuit which generates a series of pulse signals. A filter circuit converts the series of pulses into a substantially sinusoidal signal. An amplifier converts the substantially sinusoidal signal into a substantially square wave signal.

In one embodiment, the ring oscillator circuit includes a plurality of inverter circuits connected in series. The supply voltage to the inverters can be varied to control the oscillation frequency.

The filter circuit receives the series of pulses from the ring oscillator circuit. It filters the pulses to convert them into a sinusoidal signal. The filter can include a low-pass filter which removes high-frequency components and tends to smooth the pulses into the sinusoidal signal. The filter can include an ac coupling capacitor which passes the ac components of the pulses and blocks the dc components of the pulses. The resulting approximate sinusoidal signal is substantially symmetrical about the reference potential of the system.

In one embodiment, the frequency of the square wave generated by the system is between 600 MHz and 1.5 GHz. In one particular embodiment, the frequency is above 1 GHz.

The VCO circuit and method of the invention provide substantial advantages over prior approaches. Because the circuit of the invention filters the output of the ring oscillator circuit, a substantially sinusoidal signal is applied to the amplifier to produce the square wave output. The symmetry of the sinusoidal signal results in a square wave signal that is also highly symmetrical and is accurate and controllable. As a result, the square wave signal can be used in the demanding high-speed processing environment.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
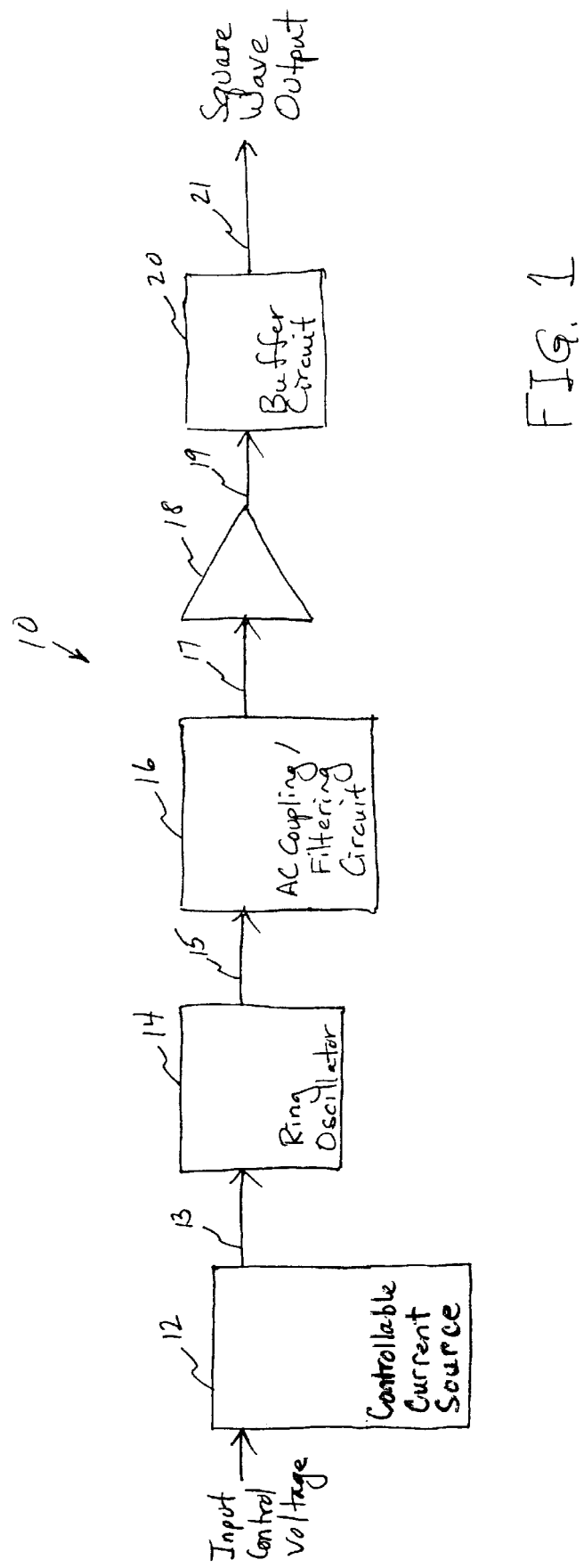
FIG. 1 is a top-level block diagram of one embodiment of a voltage-controlled oscillator in accordance with the present invention.

FIG. 1 is a schematic block diagram of one embodiment of a VCO circuit 10 in accordance with the invention. The circuit 10 generates a voltage signal from an input control voltage applied to a controllable current source 12 and uses that signal to generate a square wave output signal at output 21. The frequency of the output signal is controlled by the voltage of the signal at 13 from the controllable current source 12.

The voltage signal generated by the controllable current source is applied to the $V_{DD}$ of a ring oscillator circuit 14. In response, the ring oscillator circuit 14 generates a series of pulses and provides them as an output signal at 15. The series of pulses is ac coupled through filtering circuitry 16 to convert the series of pulses into a substantially sinusoidal signal. The filtering circuitry 16 is designed to remove high-frequency components from the series of pulses such that the resulting signal has a substantially pure sinusoidal shape. The ac coupling circuitry blocks any dc components in the series of pulses. The result is a substantially pure sine wave symmetrical in voltage level about a reference of the system.

The sinusoidal signal is provided at 17 to an amplifier circuit 18. The amplifier 18 amplifies the sinusoidal signal to generate a square wave output at 19. The amplifier 18 also restores a dc bias to the signal such that the square wave has the desired dc characteristics. The square wave at 19 is buffered by a buffering/driving circuit 20, and the resulting buffered square wave is output at 21.

Because the square wave output is generated from an amplified sine wave, it exhibits a very high level of symmetry in time, i.e., it has a precise 50-50 duty cycle. It is therefore suitable for use as a clock signal in high-frequency processing systems in which both rising and falling edges of the clock are used to control and synchronize system events.

Figure 2:
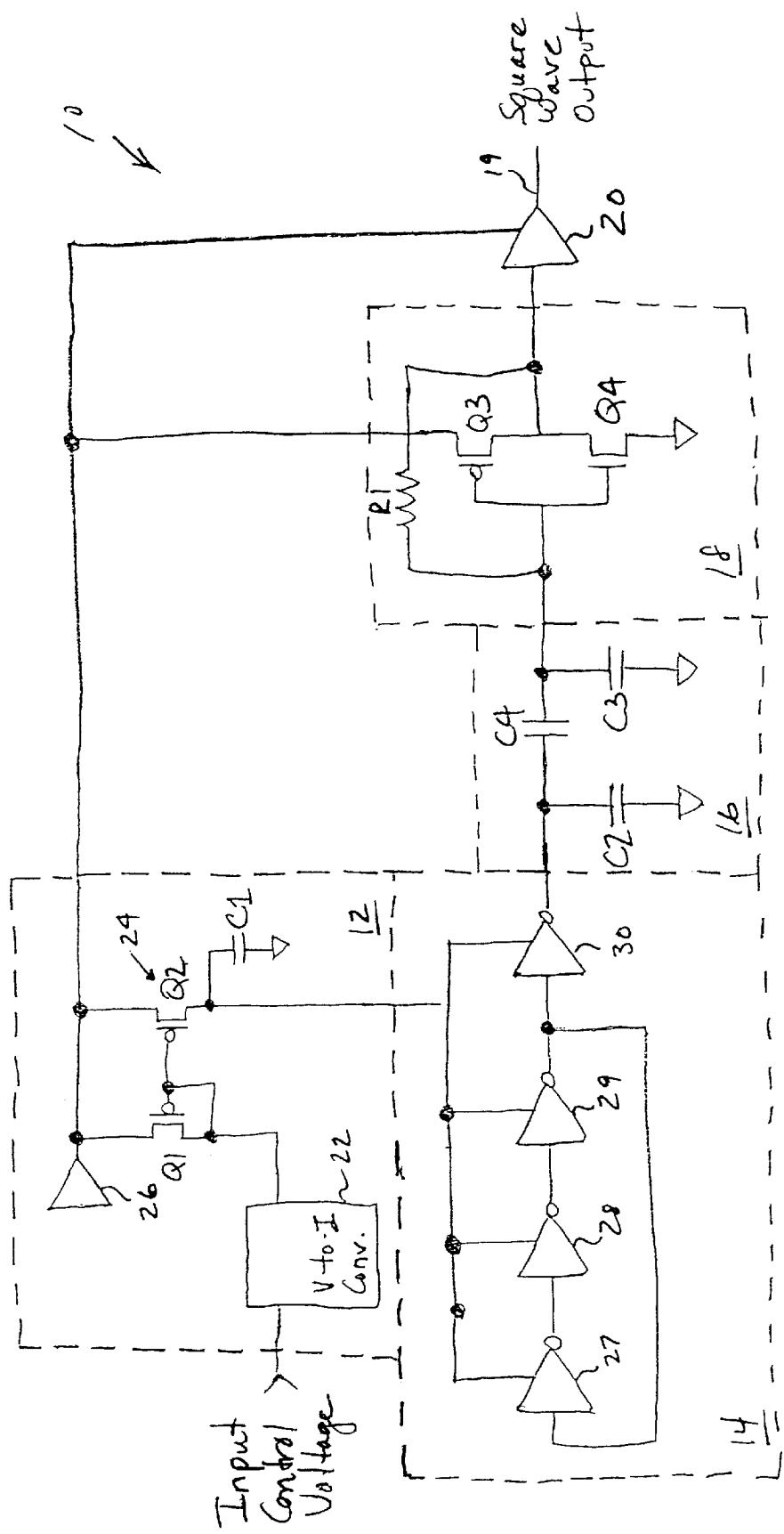
FIG. 2 is a detailed block diagram of the VCO of FIG. 1.

FIG. 2 is a detailed schematic block diagram of one embodiment of the VCO circuit 10 of FIG. 1. As shown in FIG. 2, the controllable voltage source 12 includes a dc supply 26 coupled to a current mirror circuit 24, which includes FETs Q1 and Q2. An input control voltage is applied to a voltage-to-current converter 22 which converts the input control voltage to a current for controlling the output voltage of the current mirror circuit 24.

The output voltage of the current mirror circuit 24 is filtered by a capacitor C1 and is applied to the $V_{DD}$ inputs of inverters 27, 28, 29 and 30 in the ring oscillator circuit 14. The ring oscillator, which includes the inverter circuits 27, 28, 29 and 30, oscillates to produce a series of periodic square pulses for application to the ac coupling and filtering circuitry 16. The frequency at which the ring oscillator runs, and therefore the frequency of the series of pulses, is controlled by the $V_{DD}$ voltage applied to the inverters 27, 28, 29 and 30. Hence, since the input control voltage controls the voltage generated by the controllable voltage circuit 12, it also controls the frequency of the signal generated by the ring oscillator and, therefore, the VCO 10.

The series of pulses generated by the ring oscillator 14 is applied to the ac coupling and filtering circuitry 16, which includes three capacitors C2, C3 and C4 connected as shown. The capacitors act as a low-pass filter to remove high-frequency components from the series of pulses. Capacitor C4 also acts as an ac coupling or dc blocking capacitor to remove dc components from the pulses. As a result, the filtering circuitry 16 produces a substantially pure sine wave symmetrical in voltage level about the reference potential of the system.

The sine wave out of the filtering circuitry 16 is applied to an amplifier circuit 18. The amplifier circuit 18 includes a pair of FETs Q3 and Q4 as well as a DC bias resistor R1. The amplifier amplifies the sine wave to produce a substantially symmetrical square wave. The amplifier circuit also restores a dc level to the signal such that the square wave is compatible with the associated logic circuitry. The square wave is then applied to a buffer circuit 20 which drives the square wave on the output 19. The square wave output signal from the VCO 10 of the invention can then be applied in any number of possible settings, including, for example, as the clock signal in a microprocessor system.

In one particular embodiment, the circuit of the invention is implemented in CMOS technology circuits. Specifically, the circuit can be implemented in any type of CMOS, including but not limited to 0.25 micron CMOS technology.

In one particular embodiment of the invention, to maintain compatibility with CMOS circuitry, the dc supply 26 is set to approximately 2.5 Volts. The input control voltage applied to the input of the voltage-to-current converter 22 can range between 0.0 and 1.5 Volts. The ring oscillator 14 can run at 1.2 Volts, and the output of the filter circuit 16 can be at approximately 600 mV peak-to-peak.

The VCO of the invention can be used to achieve square wave frequencies in the Gigahertz range. Specifically, the VCO of the invention can achieve a frequency of between 600 MHz and 1.5 GHz., and in one particular embodiment, a 1 GHz signal is generated. In prior systems, high-frequency square waves could be obtained by running a ring oscillator at twice the desired VCO frequency and then frequency dividing the signal to achieve the desired final frequency. In the VCO of the present invention, because of the ac filtering and coupling of the invention, the circuit of the invention achieves a highly symmetrical square wave without the need for any frequency division.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A voltage-controlled oscillator circuit comprising:
    a control circuit for receiving an input control voltage and generating therefrom a frequency control signal;
    a ring oscillator circuit for generating a series of pulse signals, a frequency of the series of pulses being controlled by a supply voltage input to the ring oscillator circuit, the supply voltage input being derived from the frequency control signal;
    a filter circuit for converting the series of pulses into a substantially sinusoidal signal; and
    an amplifier circuit for converting the substantially sinusoidal signal into a substantially square wave signal, a frequency of the substantially square wave signal being controlled by the input control voltage.

2. The voltage-controlled oscillator circuit of claim 1 wherein the ring oscillator circuit comprises a plurality of inverter circuits.

3. The voltage-controlled oscillator circuit of claim 1 wherein the filter circuit comprises a low-pass filter.

4. The voltage-controlled oscillator circuit of claim 1 wherein the filter circuit comprises an ac coupling capacitor.

5. The voltage-controlled oscillator circuit of claim 1 wherein the filter circuit comprises a dc blocking capacitor.

6. The voltage-controlled oscillator circuit of claim 1 wherein the substantially square wave signal has a frequency above 1 GHz.

7. The voltage-controlled oscillator circuit of claim 1 wherein the substantially square wave signal has a frequency between 600 MHz and 1.5 GHz.

8. A method of generating a substantially square wave signal from a voltage-controlled oscillator, the method comprising:
    generating a frequency control signal from an input control voltage,
    generating a series of pulse signals from a ring oscillator circuit, a frequency of the series of pulses being controlled by a supply voltage input to the ring oscillator circuit, the supply voltage input being derived from the frequency control signal;
    filtering the series of pulses to convert the series of pulses into a substantially sinusoidal signal; and
    amplifying the substantially sinusoidal signal to convert the substantially sinusoidal signal into the substantially square wave signal, a frequency of the substantially square wave signal being controlled by the input control voltage.

9. The method of claim 8 further comprising forming the ring oscillator circuit from a plurality of inverter circuits.

10. The method of claim 8 wherein filtering the series of pulses comprises low-pass filtering the series of pulses.

11. The method of claim 8 wherein filtering the series of pulses comprises ac coupling the series of pulses to an amplifier.

12. The method of claim 11 wherein ac coupling the series of pulses to an amplifier comprises blocking a dc component of the series of pulses.

13. The method of claim 8 wherein the substantially square wave signal has a frequency above 1 GHZ.

14. The method of claim 8 wherein the substantially square wave signal has a frequency between 600 MHz and 1.5 GHz.

* * * * *